United States Patent
Lu et al.

(10) Patent No.: US 9,947,627 B2
(45) Date of Patent: Apr. 17, 2018

(54) GUARD RING STRUCTURE AND METHOD FOR FORMING THE SAME

(71) Applicant: MediaTek Singapore Pte. Ltd., Singapore (SG)

(72) Inventors: Chiyuan Lu, San Jose, CA (US); Chien-Chih Lin, Hsinchu (TW); Cheng-Chou Hung, Hukou Township, Hsinchu County (TW); Yu-Hua Huang, Hsinchu (TW)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/186,937

(22) Filed: Jun. 20, 2016

(65) Prior Publication Data
US 2016/0300801 A1    Oct. 13, 2016

Related U.S. Application Data

(63) Continuation of application No. 14/020,367, filed on Sep. 6, 2013, now Pat. No. 9,397,032.

(Continued)

(51) Int. Cl.
| | |
|---|---|
| H01L 23/48 | (2006.01) |
| H01L 23/00 | (2006.01) |
| H01L 23/498 | (2006.01) |
| H01L 21/768 | (2006.01) |
| H01L 23/58 | (2006.01) |
| H01L 21/761 | (2006.01) |
| H01L 29/06 | (2006.01) |

(Continued)

(52) U.S. Cl.
CPC .......... *H01L 23/564* (2013.01); *H01L 21/761* (2013.01); *H01L 21/76802* (2013.01); *H01L 23/498* (2013.01); *H01L 23/585* (2013.01); *H01L 29/0623* (2013.01); *H01L 27/0814* (2013.01); *H01L 29/872* (2013.01); *H01L 2924/00* (2013.01); *H01L 2924/0002* (2013.01)

(58) Field of Classification Search
CPC ............. H01L 23/498; H01L 21/76802; H01L 23/485; H01L 27/0814; H01L 29/872; H01L 2924/00; H01L 2924/0002; H01L 21/761
USPC ........ 257/741, 774, 409, 484, 452, E27.062; 438/637, 140, 454
See application file for complete search history.

(56) References Cited

U.S. PATENT DOCUMENTS

| | | |
|---|---|---|
| 6,537,849 B1 | 3/2003 | Tsai et al. |
| 6,943,063 B2 | 9/2005 | Tsai et al. |

(Continued)

FOREIGN PATENT DOCUMENTS

| | | |
|---|---|---|
| CN | 1519924 | 8/2004 |
| CN | 100508171 | 7/2009 |
| KR | 100812084 | 9/2005 |

*Primary Examiner* — Thinh T Nguyen
(74) *Attorney, Agent, or Firm* — McClure, Qualey & Rodack, LLP

(57) ABSTRACT

A guard ring structure having a semiconductor substrate with a circuit region encircled by a first ring and a second ring. At least one of the first and second ring includes: a plurality of separated doping regions formed in various top portions of the semiconductor substrate, providing P-N junction or N-P junction on bottom of the plurality of separated doping regions; and an interconnect element formed over the semiconductor substrate, covering at least portion of the plurality of separated doping regions.

11 Claims, 12 Drawing Sheets

Related U.S. Application Data

(60) Provisional application No. 61/698,443, filed on Sep. 7, 2012.

(51) Int. Cl.
  *H01L 27/08* (2006.01)
  *H01L 29/872* (2006.01)

(56) References Cited

U.S. PATENT DOCUMENTS

| | | | |
|---|---|---|---|
| 6,998,712 B2* | 2/2006 | Okada | H01L 22/32 257/758 |
| 7,550,850 B2* | 6/2009 | Nakashiba | H01L 21/823878 257/508 |
| 2003/0071280 A1 | 4/2003 | Yu | |
| 2004/0150070 A1* | 8/2004 | Okada | H01L 22/32 257/508 |
| 2004/0217477 A1 | 11/2004 | Tsai | |
| 2005/0179111 A1 | 8/2005 | Chao | |
| 2006/0102980 A1* | 5/2006 | Nakashiba | H01L 21/823878 257/508 |
| 2007/0102792 A1 | 5/2007 | Wu | |
| 2008/0061397 A1 | 3/2008 | Uchida | |
| 2012/0313217 A1 | 12/2012 | Hung | |

* cited by examiner

GUARD RING STRUCTURE AND METHOD FOR FORMING THE SAME

CROSS REFERENCE TO RELATED APPLICATIONS

This application is a Continuation of pending U.S. patent application Ser. No. 14/020,367, filed on Sep. 6, 2013, now U.S. Pat. No. 9,397,032, which claims the benefit of U.S. Provisional Application No. 61/698,443 filed Sep. 7, 2012, the entireties of which are incorporated by reference herein.

BACKGROUND OF THE INVENTION

Field of the Invention

The present invention relates to integrated circuit (IC) devices, and in particularly, to a guard ring structure for an IC device and a method for forming the same.

Description of the Related Art

In a semiconductor process, a plurality of dies, each containing integrated circuits (ICs), are fabricated on a semiconductor wafer at one time. Advances in semiconductor processing technologies, such as high-resolution photolithography and anisotropic plasma etching, have dramatically reduced the feature sizes of formed semiconductor devices in the integrated circuit and increased the device packing density. Other process technologies, such as die scribing for separating dies within a wafer and fuse blowing for improving the yield of circuit elements in the ICs, however, induce lateral stresses which spread along boundaries of the die. The lateral stresses may further progress into a core circuitry of the die, thus reducing yield and performance thereof. In addition, oxidation of the ICs in the die induced by environment moisture also reduces yield and performance thereof.

Therefore, a guard ring structure is needed to be formed around a semiconductor die for the purposes of moisture isolation and structural reinforcement of the ICs therein.

BRIEF SUMMARY OF THE INVENTION

An exemplary guard ring structure comprises a semiconductor substrate with a circuit region encircled by a first ring and a second ring. In one embodiment, the semiconductor substrate has a first dopant type, and the first and second ring respectively comprises a plurality of separated first doping regions formed in a top portion of the semiconductor substrate, having a second dopant type opposite to the first dopant type; and an interconnect element formed over the semiconductor substrate, covering the first doping regions.

Another exemplary guard ring structure comprises a semiconductor substrate with a circuit region encircled by a first ring and a second ring. In one embodiment, the semiconductor substrate has a first dopant type, and the first and second ring respectively comprises: a first doping region embedded in a portion of the semiconductor substrate, having a second dopant type opposite to the first dopant type; and an interconnect element formed over the semiconductor substrate, covering the first doping region.

An exemplary method for forming a guard ring structure comprises: providing a semiconductor substrate having a first doping region formed over a top portion thereof, wherein the semiconductor substrate has a first dopant type and the first doping region has the first dopant type or a second dopant type opposite to the first dopant type; forming a plurality of patterned photoresist layers over the semiconductor substrate, encircling the semiconductor substrate, wherein each of the patterned photoresist layers comprises a plurality of parallel strip portions extending along a first direction and a plurality of bridge portions formed between the parallel strip portions and extending along a second direction perpendicular to the first direction; performing an etching process to the first doping region using the patterned photoresist layers as an etching mask, removing the first doping region not covered by the patterned photoresist layers and forming a plurality of patterned first doping regions, wherein each of the patterned first doping regions comprises a plurality of parallel strip portions extending along the first direction and a plurality of bridge portions formed between the parallel strip portions and extending along the second direction perpendicular to the first direction; removing the patterned photoresist layers; forming an isolation region between and adjacent to the patterned first doping regions; and forming a plurality of interconnect elements over the semiconductor substrate, respectively covering one of the patterned first doping regions thereunder.

Another exemplary method for forming a guard ring structure comprises: providing a semiconductor substrate having a first doping region formed over a top portion thereof, wherein the semiconductor substrate has a first dopant type and the first doping region has the first dopant type or a second dopant type opposite to the first dopant type; forming a plurality of patterned photoresist layers over the semiconductor substrate, encircling the semiconductor substrate, wherein each of the patterned photoresist layers comprises a plurality of parallel strip portions extending along a first direction and a plurality of arm portions extending from opposite sides of each of the parallel strip portions along a second direction perpendicular to the first direction; performing an etching process to the first doping region using the patterned photoresist layers as an etching mask, removing the first doping region not covered by the patterned photoresist layers and forming a plurality of patterned first doping regions, wherein each of the patterned first doping regions comprises a plurality of parallel strip portions extending along the first direction and a plurality of arm portions formed between the parallel strip portions and extending along the second direction perpendicular to the first direction; removing the patterned photoresist layers; forming an isolation region between and adjacent to the patterned first doping regions; and forming a plurality of interconnect elements over the semiconductor substrate, respectively covering one of the patterned first doping regions thereunder.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
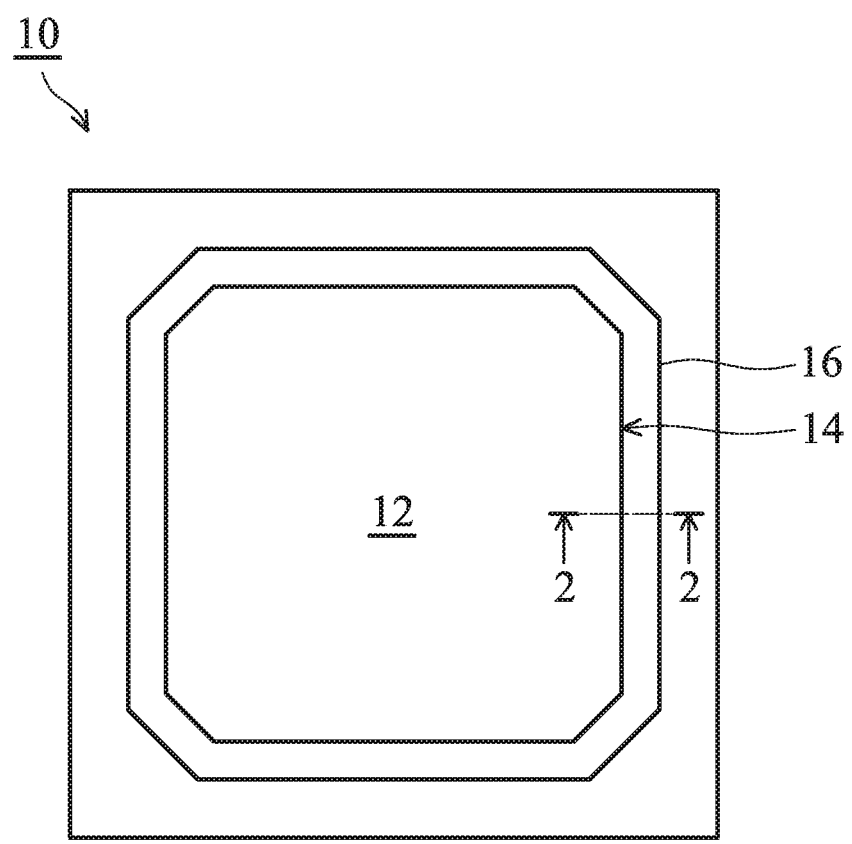
FIG. 1 is schematic top view of an integrated circuit die according to an embodiment of the invention.

FIG. 1 is a schematic top view of an exemplary integrated circuit (IC) die 10 having a circuit region 12 encircled by a guard ring structure comprising two rings 14 and 16 for moisture isolation and structural reinforcement of the integrated circuits (ICs, not shown) therein. As shown in FIG. 1, the circuit region 12 of the IC die 10 is encircled by the guard ring structure comprising an inner ring 14 relatively close to the circuit region 12 and an outer ring 16 relatively close to an edge of the IC die 10.

Figure 2:
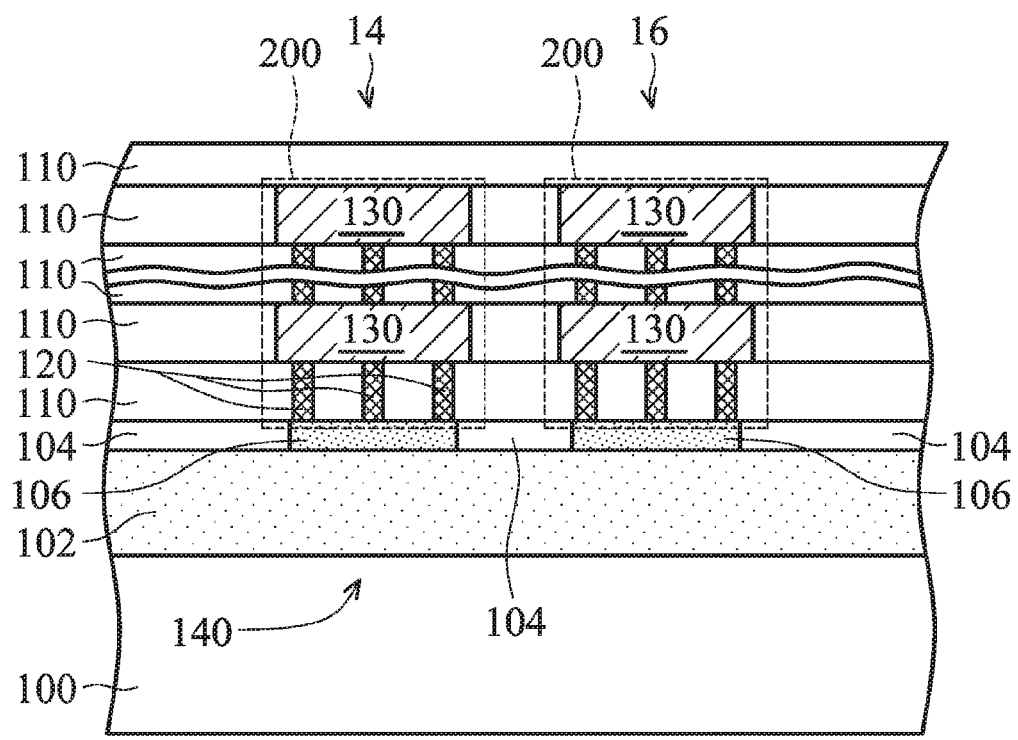
FIG. 2 is a schematic cross section along line 2-2 of integrated circuit die shown in FIG. 1, showing a guard ring structure according to an embodiment of the invention.

FIG. 2 is a schematic cross section along line 2-2 of the IC die 10 shown in FIG. 1, showing the rings 14 and 16 of the guard ring structure. The guard ring structure of the IC die 10 shown in FIG. 2 is a comparative embodiment for describing an undesired substrate noise coupling issue that may propagate along the guard ring structure found by the inventors, and does not limit the scope of the present application.

As shown in FIG. 2, the rings 14 and 16 are defined in and over different portions of a semiconductor substrate 100, respectively comprise a well region 102 embedded in the semiconductor substrate 100, a doping region 106 formed in a portion of the semiconductor substrate 100 overlying the well region 102, and an interconnect element 200 formed over the doping region 106. The well region 102 is a doping region blanketly embedded in the semiconductor substrate 100. In addition, a plurality of isolation regions 104 such as shallow trench isolation (STI) regions is formed over portions of the semiconductor substrate 100 between and adjacent to the doping regions 106 to isolate thereof from each other.

In one embodiment, the semiconductor substrate 100 can be an intrinsic substrate such as a bulk silicon substrate and is provided with a first dopant type such as p-type. At this time, the well region 102 can be, for example, a doping region of the first dopant type and has a resistivity lower than that of the semiconductor substrate 100. Also, the doping region 106 can be, for example, a doping region of the first dopant type, having a resistivity lower than that of the well region 102.

An interconnect element 200 is substantially located over the doping region 106 and may comprise a plurality of dielectric layers 110 sequentially stacked over the semiconductor substrate 100, having a plurality of conductive vias 120 and conductive lines 130 alternately formed in one of the dielectric layers 110. A metallic-silicide region (not shown) may be provided at the interface between the doping region 106 and the interconnect element 200. In one embodiment, the conductive vias 120 and the conductive lines 130 in the interconnect element 200 may comprise conductive materials such as copper or aluminum, such that the rings 14 and 16 may become a good conductor to couple substrate noise 140 from the electrical devices such as clock digital logic circuits formed in a portion (not shown) of the circuit region 12 (see FIG. 1), and the substrate noise 140 coupled to the rings 14 and 16 may be thus delivered along, for example, the interconnect element 200 of the rings 14 and 16 and may be transmitted to other circuit devices such as analog circuits formed in other portions (not shown) of the circuit region 12 (see FIG. 1), thereby affecting the overall reliability of IC die 10.

Figure 3:
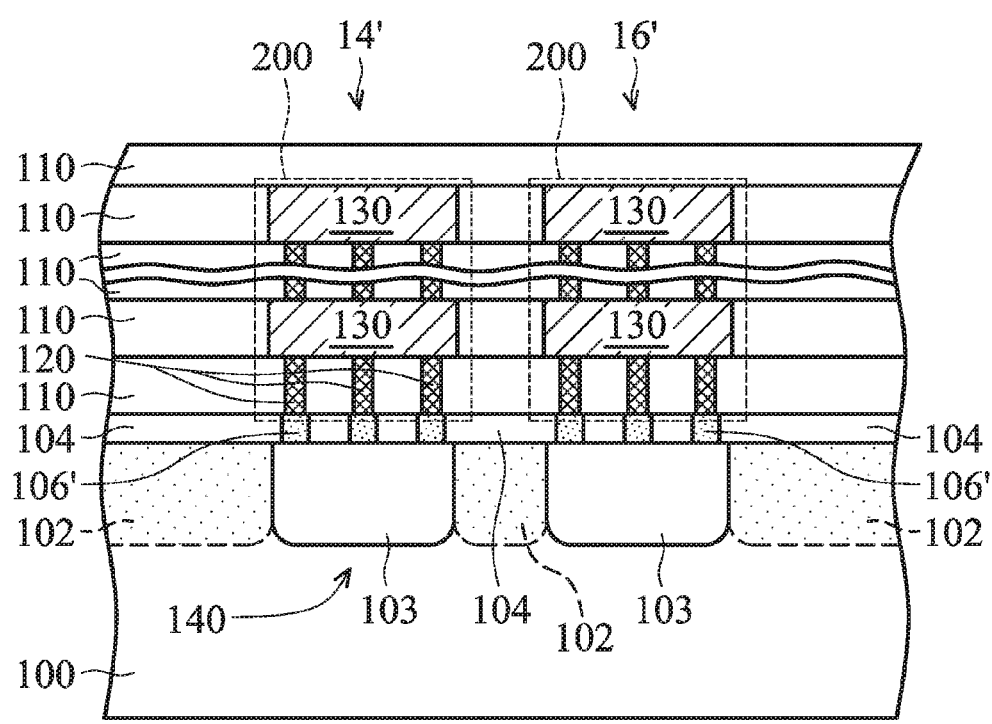
FIG. 3 is a schematic cross section showing a guard ring structure according to another embodiment of the invention.

Therefore, FIG. 3 is a cross section of exemplary rings 14' and 16' and can be applied to replace the rings 14 and 16 of the guard ring structure of the IC die 10 shown in FIGS. 1-2 for reducing or eliminating the above described substrate noise coupling issue. For the purpose of simplicity, same reference numbers in FIG. 3 represent the same elements shown in FIGS. 1-2, and only differences between the rings 14, 16, 14' and 16' are discussed as follows.

As shown in FIG. 3, the rings 14' and 16' are formed over various portions of the semiconductor substrate 100, respectively, comprising a doping region 103 embedded in a portion of the semiconductor substrate 100, a plurality of doping regions 106' formed in various portions of the semiconductor substrate 100 overlying the doping region 103, and an interconnect element 200 formed over the doping regions 106'. At this time, the doping region 103 is underlying the interconnect element 200 and is isolated from the adjacent doping region 103 by the well region 102 formed therebetween. In addition, a plurality of isolation regions 104 such as shallow trench isolation (STI) regions is also formed over various portions of the semiconductor substrate 100 and are between and adjacent to the doping regions 106' to isolate the doping regions 106' from each other. Similarly, a metallic-silicide region (not shown) may be provided at the interface between the doping regions 106' and the interconnect element 200.

In one embodiment, the semiconductor substrate 100 can be, for example, a bulk silicon substrate and is provided with a first dopant type, for example, p-type. At this time, the well regions 102 can be, for example, a doping region of the first dopant type, having a resistivity lower than that of the semiconductor substrate 100. The doping regions 103 can be, for example, a doping region of a second dopant type opposite to the first dopant type, such as n-type, having a resistivity lower than that of the semiconductor substrate 100. The doping regions 106' can be, for example, a doping region of the first dopant type, having a resistivity lower than that of the well region 102.

Due to formation of the doping region 103 of the dopant type opposite to that of the semiconductor substrate 100 and the doping regions 106 in each of the rings 14' and 16', a P-N junction diode may be formed at an interface between the semiconductor substrate 100 and the doping regions 103, and a plurality of N-P junction diodes can be formed at an interface between the doping region 103 and the doping regions 106', such that the substrate noises 140 shown in FIG. 3 of a predetermined frequency not greater than 1 GHz can be greatly reduced or even rejected by the diodes, and/or the substrate noise 140 of a predetermined frequency greater than 1 GHz can also be suppressed by the diodes, thereby preventing transmission of the substrate noise by the interconnect element 200 therein.

Figure 4:
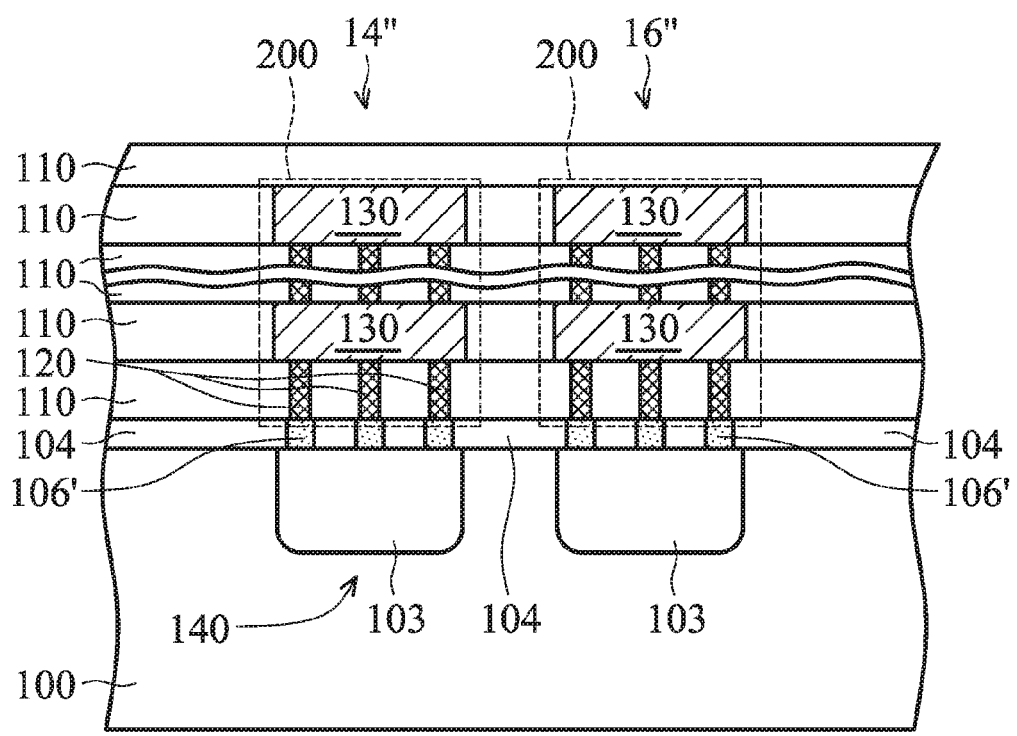
FIG. 4 is a schematic cross section showing a guard ring structure according to yet another embodiment of the invention.

Moreover, FIG. 4 is a schematic cross section of other exemplary rings 14" and 16" and can be applied to replace the rings 14 and 16 of the guard ring structure shown in IC die 10 shown in FIGS. 1-2 for reducing or eliminating the above described substrate noise coupling issues. The rings 14" and 16" are modified from the rings 14' and 16' shown in FIG. 3. For the purpose of simplicity, same reference numbers in FIG. 4 represent the same elements shown in FIGS. 1-3, and only differences between the rings 14, 16, 14', 16', 14", and 16" are discussed as follows.

As shown in FIG. 4, the rings 14" and 16" are formed over various portions of the semiconductor substrate 100, respectively, comprising a doping region 103 embedded in a portion of the semiconductor substrate 100, a plurality of doping regions 106' formed in various portions of the semiconductor substrate 100 overlying the doping region 103, and an interconnect element 200 formed over the doping region 106. At this time, the doping region 103 is underlying the interconnect element 200 and is isolated from the adjacent doping region 103 by the semiconductor substrate 100. In this embodiment, the well regions 102 shown in FIG. 3 are not formed in the semiconductor substrate 100. Similarly, a metallic-silicide region (not shown) may be provided at the interface between the doping region 106' and the interconnect element 200.

Due to formation of the doping regions 103 of the dopant type opposite to that of the semiconductor substrate 100 and the doping regions 106', a P-N junction diode can be formed at an interface between the semiconductor substrate 100 and the doping region 103, and a plurality of N-P junction diodes can be formed at an interface between the doping region 103 and the doping regions 106', such that the substrate noise 140 shown in FIG. 4 of a predetermined frequency not greater than 1 GHz can be greatly reduced or even rejected by the diodes, and/or the substrate noise 140 of a predetermined frequency greater than 1 GHz can also be suppressed by the diodes, thereby preventing transmission of the substrate noise by the interconnect element 200 therein.

Figure 5:
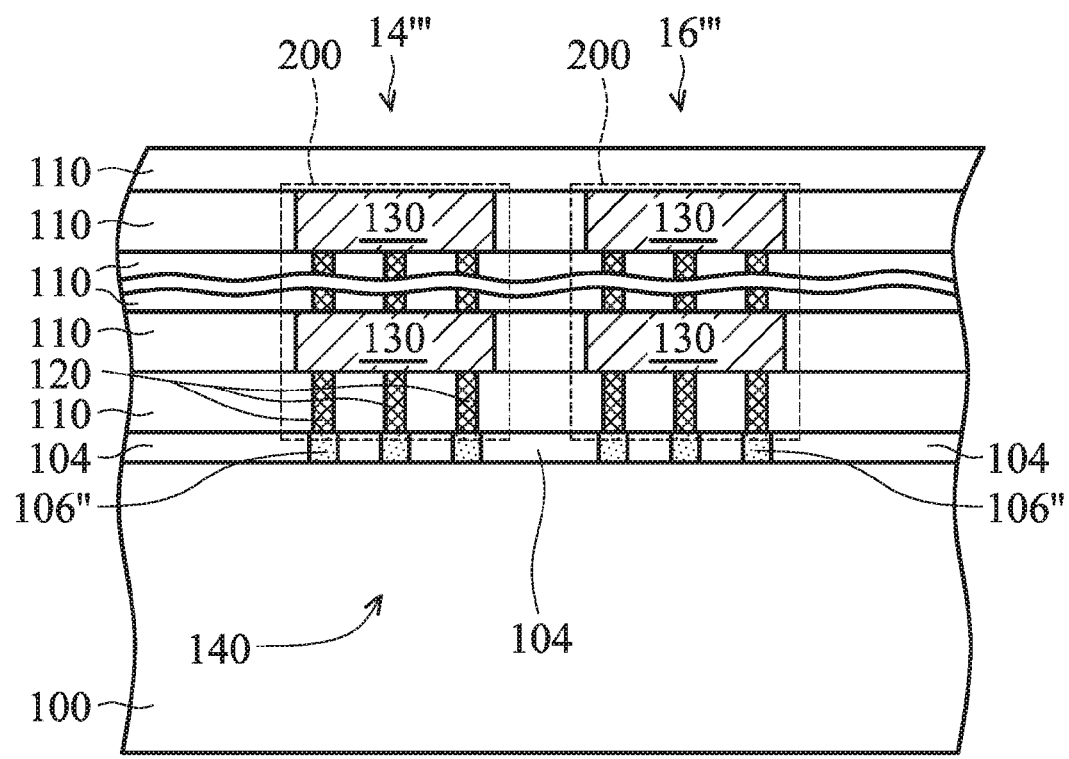
FIG. 5 is a schematic cross section showing a guard ring structure according to another embodiment of the invention.

Furthermore, FIG. 5 is a schematic cross section of other exemplary rings 14''' and 16''' and can be applied to replace the rings 14 and 16 of the guard ring structure shown in IC die 10 shown in FIGS. 1-2 for reducing or eliminating the above described substrate noise coupling issues. The rings 14''' and 16''' are modified from the rings 14' and 16' shown in FIG. 3. For the purpose of simplicity, same reference numbers in FIG. 5 represent the same elements shown in FIGS. 1-3, and only differences between the rings 14', 16', 14", and 16" are discussed as follows.

As shown in FIG. 5, the rings 14''' and 16''' are formed over various portions of the semiconductor substrate 100, respectively, comprising a plurality of doping regions 106" formed in various portions of the semiconductor substrate 100, and an interconnect element 200 formed over the doping regions 106". At this time, the doping region 106" are underlying the interconnect structure 200 and are isolated from the adjacent doping region 106" by the isolation regions 104, and no other doping region or well region are formed underlying the doping regions 106" and the isolation regions 104 of the seal ring structure in the semiconductor substrate 100. Similarly, a metallic-silicide region (not shown) may be provided at the interface between the doping region 106" and the interconnect element 200.

In one embodiment, the doping regions 106" can be, for example, of a second dopant type such as n-type opposite to the first dopant type of the semiconductor substrate 100, having a resistivity lower than that of the semiconductor substrate 100.

Due to formation of the doping regions 106" having the dopant type opposite to that of the semiconductor substrate 100, a plurality of P-N junction diodes can be formed at an interface between the semiconductor substrate 100 and the doping regions 106", such that the substrate noise 140 shown in FIG. 5 of a predetermined frequency not greater than 1 GHz can be greatly reduced or even rejected by the diodes, and/or the substrate noise 140 of a predetermined frequency greater than 1 GHz can also be suppressed by the diodes, thereby preventing transmission of the substrate noise by the interconnect element 200 therein.

Figure 6:
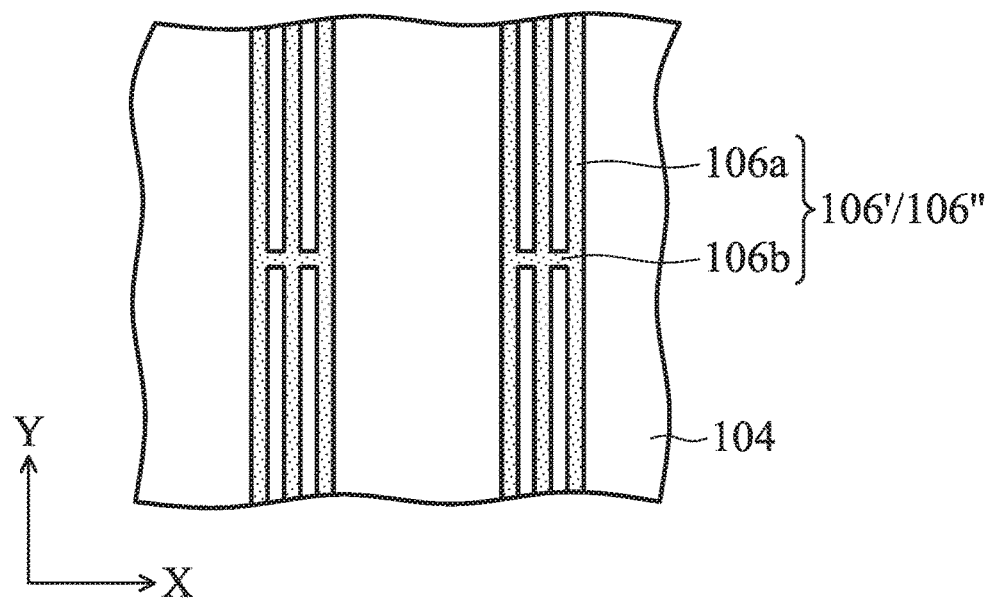
FIG. 6 is a schematic top view of a guard ring structure according to an embodiment of the invention.

FIG. 6 is a schematic top view of the rings 14', 16', 14", 16", 14''', and 16' shown in FIGS. 3-5, and for the purpose of simplicity, the interconnect elements 200 are not shown in FIG. 6. In FIG. 6, the doping regions 106'/106", respectively, comprise a plurality of parallel strip portions 106a extending over the semiconductor substrate 100 along a direction such as a Y direction in FIG. 6, and a plurality of bridge portions 106b extending between two adjacent strip portions 106a along a direction such as an X direction in FIG. 6. The strip portions 106a of the adjacent doping regions 106'/106" are mainly isolated from each other by the isolation regions 104 formed adjacent thereto.

Figure 7:
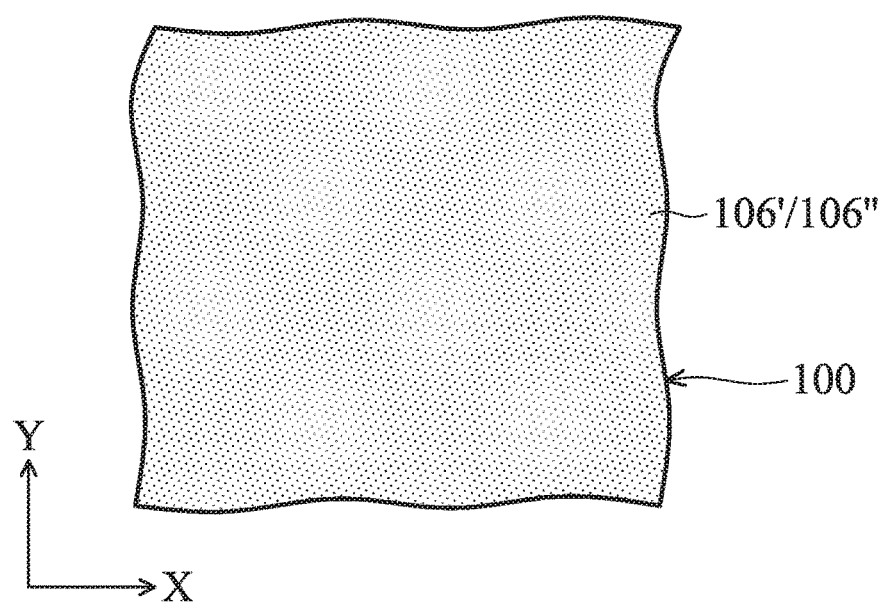
FIGS. 7-9, and 11-12 are schematic top views showing a method for fabricating a guard ring structure according to an embodiment of the invention.
Figure 8:
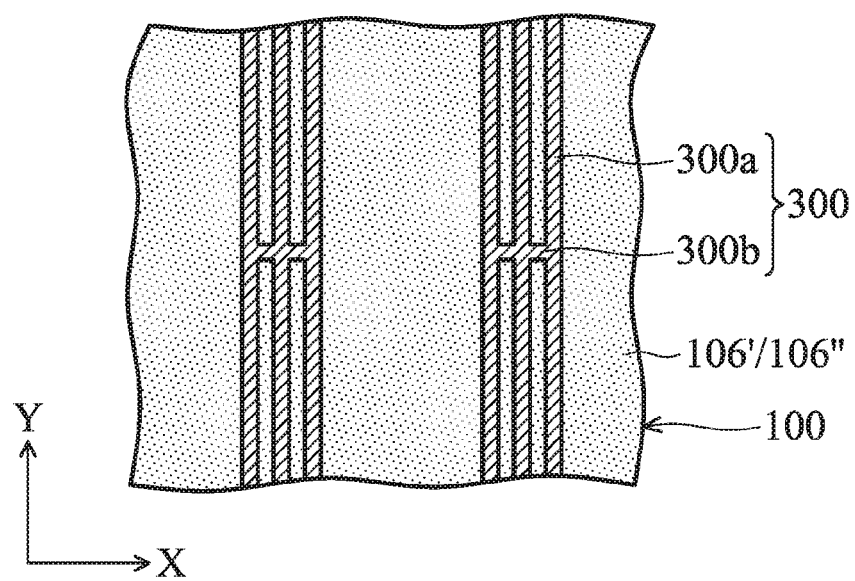
Figure 9:
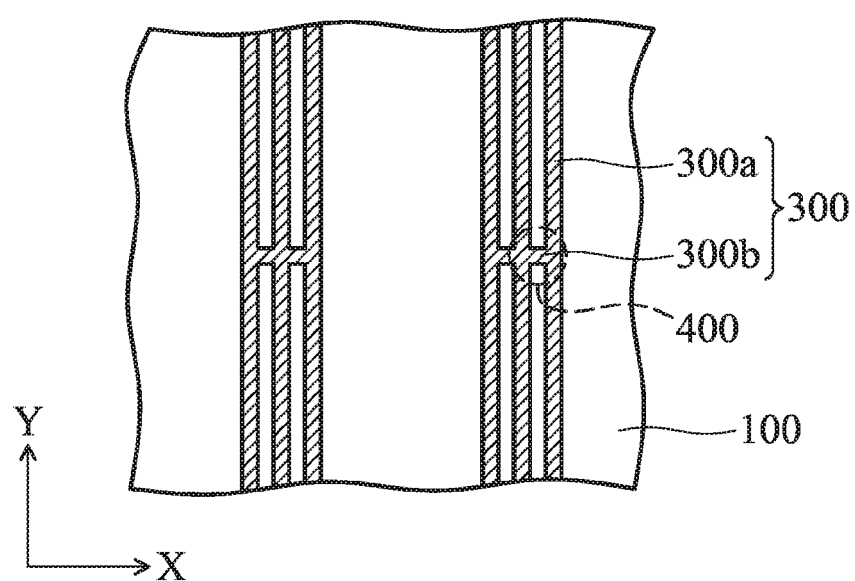
Figure 10:
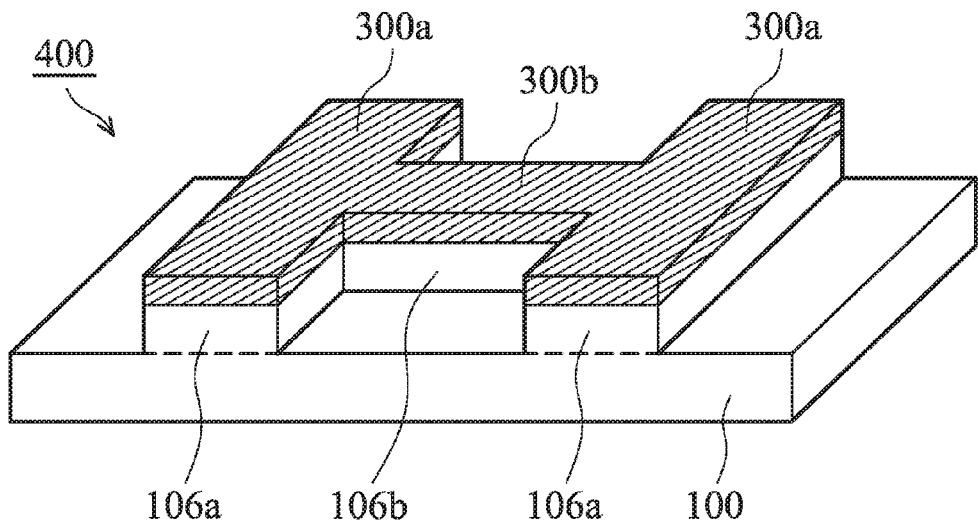
FIG. 10 is a perspective view showing a region 400 shown in FIG. 9.

FIGS. 7-9 and 11-12 are schematic top views showing an exemplary method for fabricating a guard ring structure as that shown in FIGS. 3-5 having the doping regions 106'/106", and FIG. 10 is a perspective view showing a region 400 in FIG. 9.

In FIG. 7, the semiconductor substrate 100 is provided with blanket doping regions 106'/106" thereover. The doping regions 106'/106" can be doped with either a dopant type which is the same as that of the semiconductor substrate 100 as shown in FIGS. 3-4 or with a dopant type opposite to that of the semiconductor substrate 100 as shown in FIG. 5, and may overlie the other well regions (not shown) embedded in the semiconductor substrate 100.

Next, in FIG. 8, two patterned photoresist layers 300 are formed over various portions of the semiconductor substrate 100. As shown in FIG. 8, each of the patterned photoresist layers 300 comprises a plurality of parallel strip portions 300a and a plurality bridge portions 300b formed between the strip portions 300a. The bridge portions 300b shown in FIG. 8 are aligned and respectively connected to two adjacent strip portions 300a adjacent thereto.

Next, as shown in FIG. 9, a patterning process (not shown) such as an etching process is performed on the doping regions 106'/106" exposed by the patterned photoresist layers 300 and using the patterned photoresist layers 300 as a mask layer. Therefore, the portions of the doping regions 106'/106" exposed by the patterned photoresist layers 300 are removed and the semiconductor substrate 100 is exposed. Due to formations of the bridge portions 300b in the patterned photoresist layers 300, collapsing of the long extending strip portions 300a of the patterned photoresist layers 300 formed over the semiconductor substrate 100 during the above patterning process of the doping regions 106'/106" is prevented and the pattern accuracy of the formed doping regions 106'/106" are ensured.

FIG. 10 is a perspective view showing a region 400 shown in FIG. 9, and one of the formed doping regions 106'/106" comprising two strip portions 106a and a bridge portion 106b connected thereto having the same pattern as that of the strip portions 300a and the bridge portion 300b of the patterned photoresist layers 300 formed thereabove.

Figure 11:
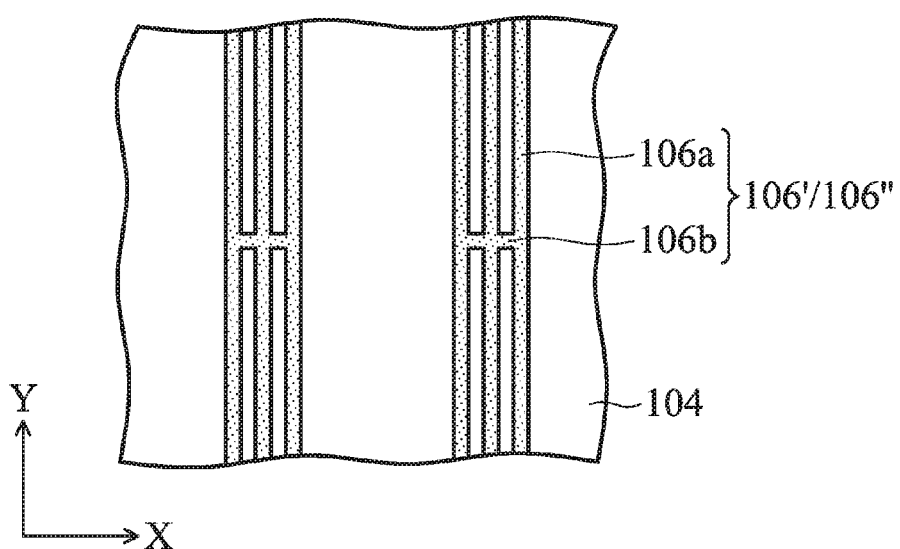

In FIG. 11, the patterned photoresist layers 300 are then removed and a plurality of patterned doping regions 106'/106" is left over the semiconductor substrate 100. Next, a dielectric material (not shown) is blanketly formed over the semiconductor substrate 100 and the patterned doping regions 106'/106", and the portion of the dielectric material over the doping regions 106'/106" are then removed by a planarization process (not shown), such as a chemical mechanical polishing process. Therefore, the patterned doping regions 106 are isolated by the isolation region 104 made of the dielectric material. As shown in FIG. 9, each of the patterned doping regions 106'/106" may comprise a plurality of parallel strip regions 106a and a plurality of bridge portions 106b connecting to the strip portions 106a as shown in FIG. 6.

Figure 12:
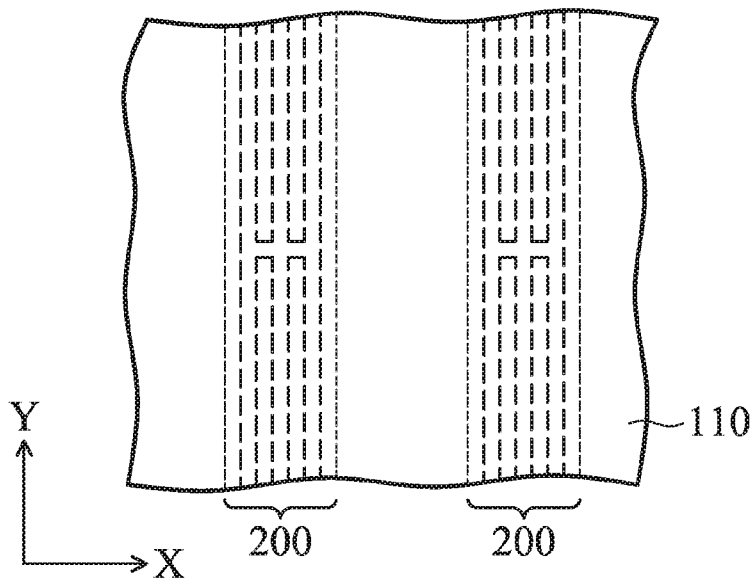

Next, conventional interconnect fabrication can be performed to the structure shown in FIG. 11, thereby forming the interconnect elements 200 respectively overlying one of the patterned doping regions 106'/106" and obtaining the guard ring structure having the schematic cross sections as shown in FIGS. 3-5. At this time, only the topmost dielectric layer 110 is shown in FIG. 12, for simplicity.

Figure 13:
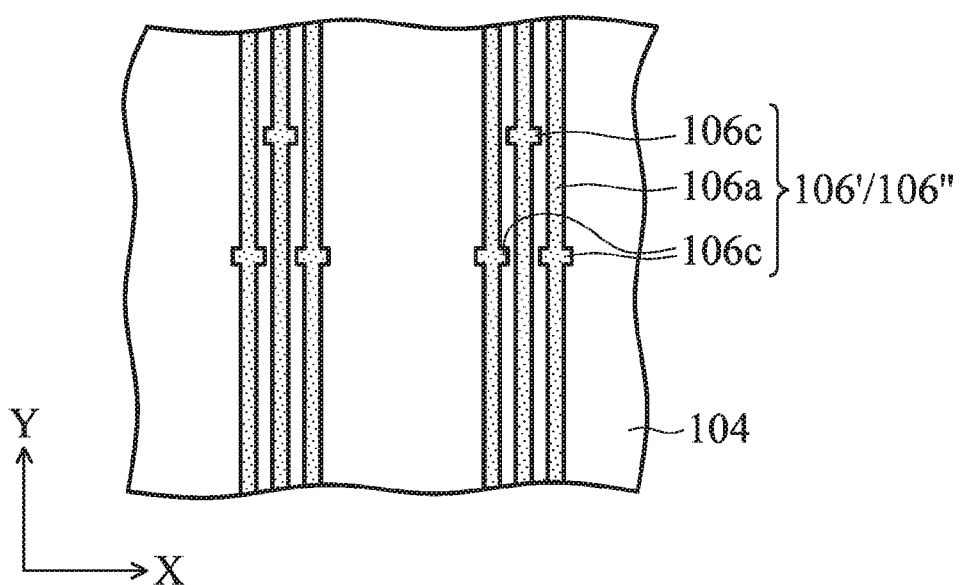
FIG. 13 is a schematic top view of a guard ring structure according to another embodiment of the invention.

FIG. 13 is another schematic top view of the rings 14', 16', 14", 16", 14"', and 16"' shown in FIGS. 3-5, and for the purpose of simplicity, the interconnect elements 200 are not shown in FIG. 13. In FIG. 13, the doping regions 106'/106", respectively, comprise a plurality of parallel strip portions 106a extending over the semiconductor substrate 100 along a direction such as a Y direction in FIG. 13, and a plurality of arm portions 106c extending to opposite sides each of the strip portions 106a along a direction such as a X direction in FIG. 13. The strip portions 106a of the adjacent doping regions 106'/106" are mainly isolated from each other by the isolation regions 104 formed adjacent thereto.

Figure 14:
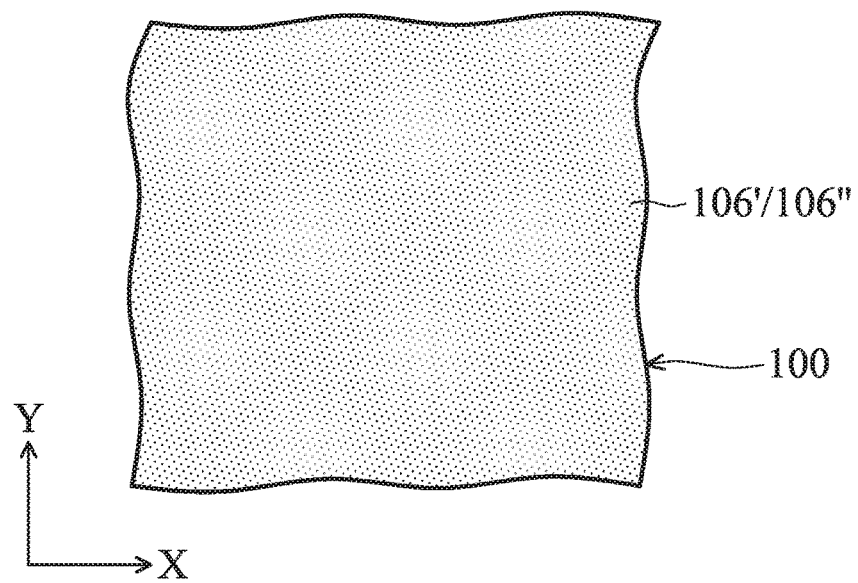
FIGS. 14-16, and 18-19 are schematic top views showing a method for fabricating a guard ring structure according to another embodiment of the invention.
Figure 15:
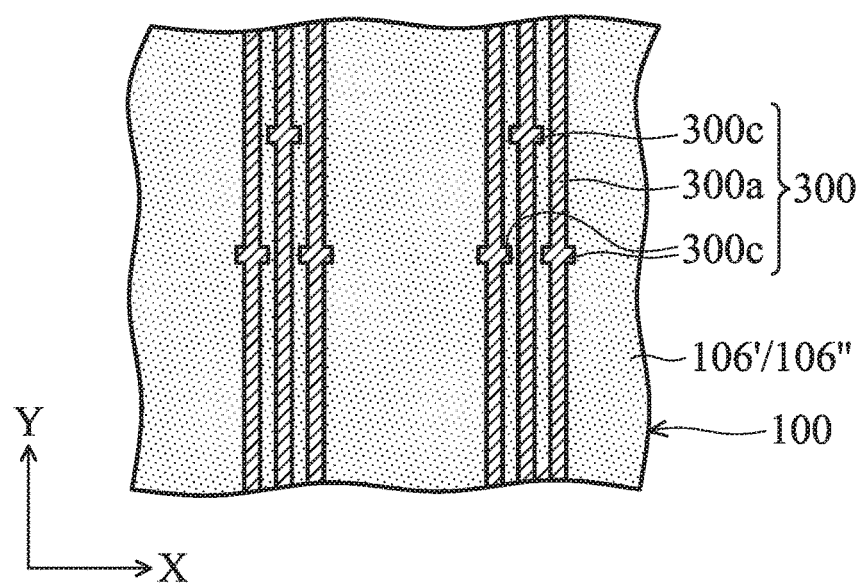
Figure 16:
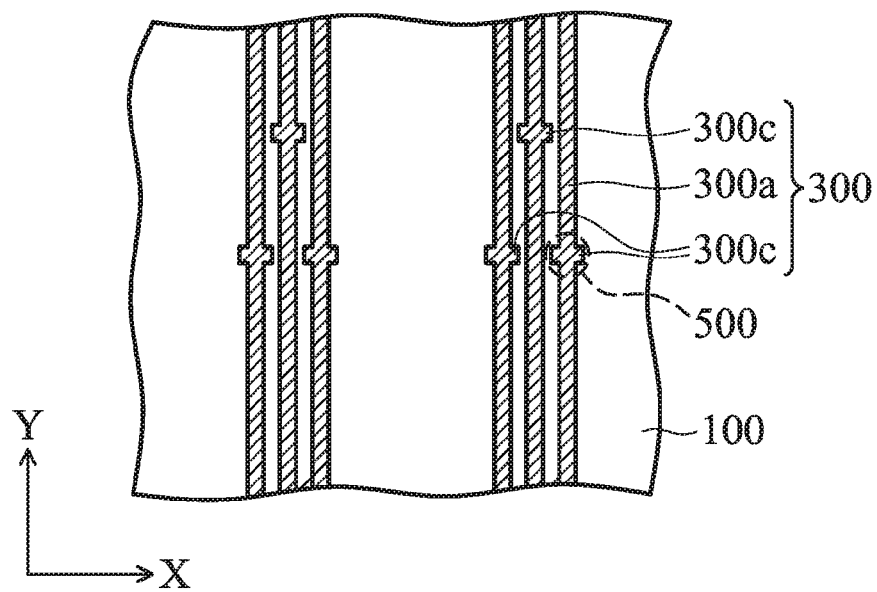
Figure 17:
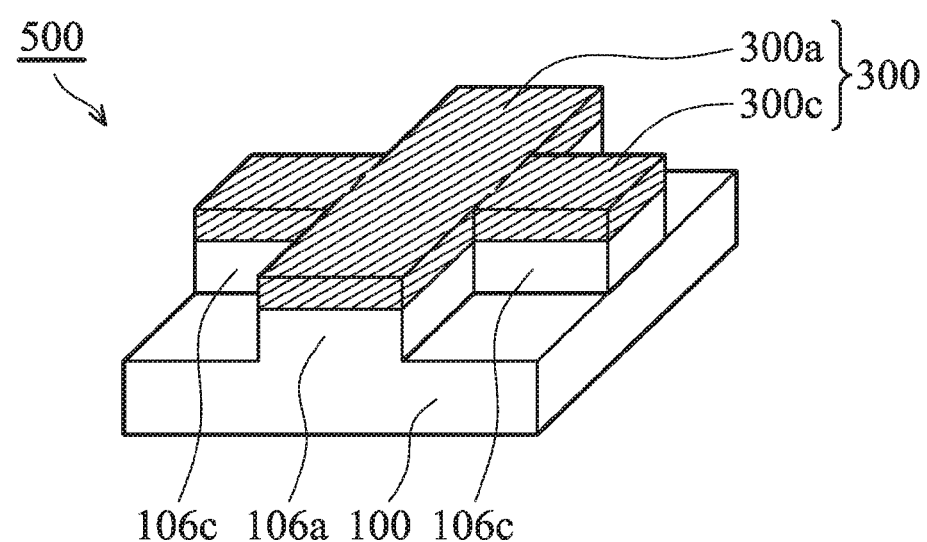
FIG. 17 is a perspective view showing a region 500 shown in FIG. 16.

FIGS. 14-16 and 18-19 are schematic diagrams showing an exemplary method for fabricating a guard ring structure as that shown in FIGS. 3-5 having the doping regions 106'/106", and FIG. 17 is a perspective view showing a region 500 in FIG. 16.

In FIG. 14, the semiconductor substrate 100 is provided with blanket doping regions 106'/106" thereover. The doping regions 106'/106" can be doped with either a dopant type which is the same as that of the semiconductor substrate 100 as shown in FIGS. 3-4 or with a dopant type opposite to that of the semiconductor substrate 100 as shown in FIG. 5, and may overlie the other well regions (not shown) embedded in the semiconductor substrate 100.

Next, in FIG. 15, two patterned photoresist layers 300 are formed over various portions of the semiconductor substrate 100. As shown in FIG. 15, each of the patterned photoresist layers 300 comprises a plurality of parallel strip portions 300a and a plurality arm portions 300c extend from opposite sides of each of the strip portions 300a. The arm portions 300c extended from each of strip portions 300a may be not aligned and are isolated from the strip portion 300a and arm portions 300c adjacent thereto.

Next, as shown in FIG. 16, a patterning process (not shown) such as an etching process is performed on the doping regions 106'/106" exposed by the patterned photoresist layers 300 and using the patterned photoresist layers 300 as a mask layer. Therefore, the portions of the doping regions 106'/106" exposed by the patterned photoresist layers 300 are removed and the semiconductor substrate 100 is exposed. Due to formations of the arm portions 300c in the patterned photoresist layers 300, such that collapsing of the long extending strip portions 300a formed over the semiconductor substrate 100 during the sequential patterning process of the doping regions 106'/106" is prevented and the pattern accuracy of the formed doping regions 106'/106" are ensured.

FIG. 17 is a schematic perspective view showing a region 500 shown in FIG. 16, and one of the formed doping regions 106'/106" comprises a strip portion 106a and two arm portions 106c connected thereto having the same pattern as that of the strip portion 300a and the arm portions 300c of the patterned photoresist layers 300 formed thereabove.

Figure 18:
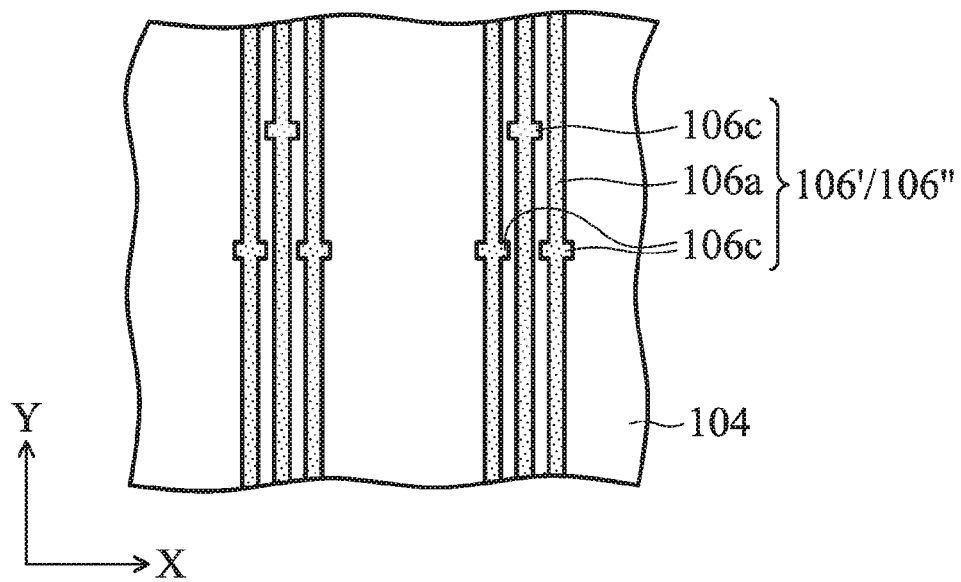

In FIG. 18, the patterned photoresist layers 300 are then removed and a plurality of patterned doping regions 106'/106" is left over the semiconductor substrate 100. Next, a dielectric material (not shown) is blanketly formed over the semiconductor substrate 100 and the patterned doping regions 106'/106", and the portion of the dielectric material over the doping regions 106'/106" are then removed by a planarization process (not shown), such as a chemical mechanical polishing process. Therefore, the patterned doping regions 106 are isolated by the isolation region 104 made of the dielectric material. As shown in FIG. 18, each of the patterned doping regions 106'/106" may comprise a plurality of parallel strip regions 106a and a plurality of arm portions 106c extending from opposite side of each of the strip portions 106a as shown in FIG. 13.

Figure 19:
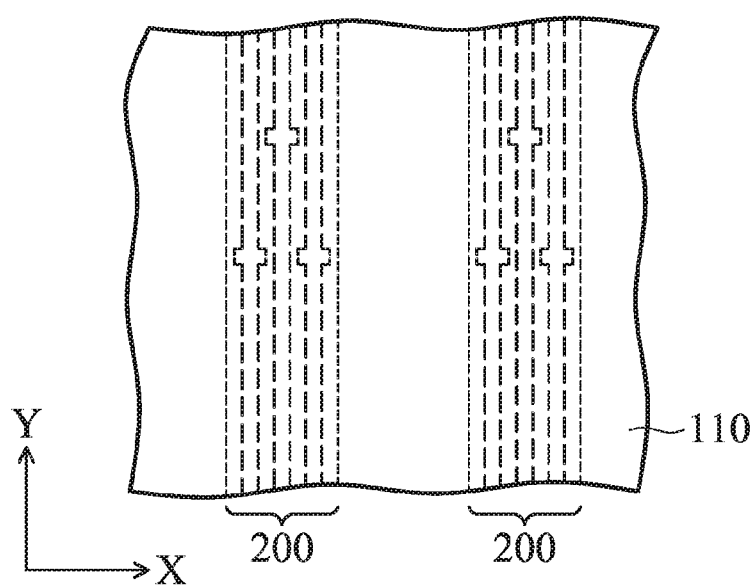

Next, conventional interconnect fabrication can be performed to the structure shown in FIG. 18, thereby forming the interconnect elements 200 respectively overlying one of the patterned doping regions 106'/106" and obtaining the guard ring structure having the schematic cross sections as shown in FIGS. 3-5. At this time, only the topmost dielectric layer 110 is shown in FIG. 19, for simplicity.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A guard ring structure, comprising
a semiconductor substrate with a circuit region encircled by a first ring and a second ring, and at least one of the first and second ring comprises:
a plurality of separated doping regions formed in various top portions of the semiconductor substrate, providing P-N junction or N-P junction on bottom of the plurality of separated doping regions; and
an interconnect element formed over the semiconductor substrate, covering at least portion of the plurality of separated doping regions, wherein the plurality of separated doping regions are electrically connected to each other via the interconnect element.

2. The guard ring structure as claimed in claim 1, further comprising an isolation region formed over the semiconductor substrate and between and adjacent to the doping regions.

3. The guard ring structure as claimed in claim 1, wherein the interconnect element comprises a plurality of levels of conductive via and conductive line that are alternately stacked over the semiconductor substrate.

4. The guard ring structure as claimed in claim 3, wherein the conductive via and conductive line comprise aluminum or copper.

5. The guard ring structure as claimed in claim 1, wherein the substrate has a first dopant type, and the doping regions have a second dopant type opposite to the first dopant type, thereby forming P-N junction or N-P junction between the substrate and the doping regions.

6. The guard ring structure as claimed in claim 1, wherein the at least one of the first and second ring further comprises:
   another doping region embedded in a portion of the semiconductor substrate and formed below the plurality of separated doping regions, wherein P-N junction or N-P junction is formed between the another doping region and the plurality of separated doping regions, or is formed between the another doping region and the substrate.

7. The guard ring structure as claimed in claim 6, wherein the plurality of separated doping regions are formed in a top portion of the semiconductor substrate, overlying the another doping region and have a first dopant type, the another doping region has a second dopant type opposite to the first dopant type, and the substrate has the first dopant type, thereby P-N junction or N-P junction is formed between the another doping region and the plurality of separated doping regions, and is formed between the another doping region and the substrate.

8. The guard ring structure as claimed in claim 7, wherein the first dopant type is p-type, and the second dopant type is n-type.

9. The guard ring structure as claimed in claim 6, wherein the another doping region comprises a resistivity lower than that of the semiconductor substrate.

10. The guard ring structure as claimed in claim 1, wherein the plurality of separated doping regions comprise a resistivity lower than that of the semiconductor substrate.

11. The guard ring structure as claimed in claim 6, further comprising a well region embedded in the semiconductor substrate and disposed adjacent to the another doping region.

\* \* \* \* \*